United States Patent [19]
Crowe

[11] Patent Number: 5,660,227
[45] Date of Patent: Aug. 26, 1997

[54] HEAT EXCHANGER FOR HIGH POWER ELECTRICAL COMPONENT

[75] Inventor: Lawrence E. Crowe, Lindenwood, Ill.

[73] Assignee: Sundstrand Corporation, Rockford, Ill.

[21] Appl. No.: 189,363

[22] Filed: Jan. 31, 1994

Related U.S. Application Data

[62] Division of Ser. No. 764,238, Sep. 23, 1991.

[51] Int. Cl.$^6$ ..................................................... F28F 7/00
[52] U.S. Cl. .................... 165/47; 165/80.3; 165/80.4; 165/80.5; 165/185; 165/908; 361/699; 361/703; 361/707
[58] Field of Search ................. 165/908, 47, 80.3, 165/80.4, 80.5, 165, 185; 361/690, 699, 707, 709, 710, 703

[56] References Cited

U.S. PATENT DOCUMENTS

| | | | |
|---|---|---|---|
| 3,361,195 | 1/1968 | Meyerhoff et al. | 361/699 |
| 4,296,455 | 10/1981 | Leaycraft et al. | 165/908 |
| 4,368,779 | 1/1983 | Rojey et al. | 165/165 |
| 4,494,171 | 1/1985 | Bland et al. | 165/908 |
| 4,559,580 | 12/1985 | Lutfy | 361/699 |
| 4,624,305 | 11/1986 | Rojey | 165/165 |
| 4,880,055 | 11/1989 | Niggemann et al. | 165/908 |
| 4,901,201 | 2/1990 | Crowe . | |
| 4,910,642 | 3/1990 | Downing | 361/690 |
| 4,936,380 | 6/1990 | Niggemann | 165/908 |
| 5,016,707 | 5/1991 | Nguyen | 165/908 |
| 5,029,640 | 7/1991 | Niggemann | 165/908 |
| 5,088,005 | 2/1992 | Ciaccio | 361/699 |
| 5,129,449 | 7/1992 | Nguyen | 165/908 |
| 5,381,859 | 1/1995 | Minakami et al. | 165/185 |

FOREIGN PATENT DOCUMENTS

| 604464 | 7/1948 | United Kingdom | 165/166 |
|---|---|---|---|

*Primary Examiner*—John K. Ford
*Attorney, Agent, or Firm*—Lawrence E. Crowe

[57] ABSTRACT

A power electronics package includes a heat exchanger having a plurality of faces, a plurality of semiconductor devices mounted on the plurality of faces and at least one bus structure for interconnecting electrodes of the semiconductor devices. The package is enclosed by a cover and structure is provided to connect other electrodes of the semiconductor devices to an external circuit.

3 Claims, 4 Drawing Sheets

HEAT EXCHANGER FOR HIGH POWER ELECTRICAL COMPONENT

This is a divisional of U.S. application Ser. No. 07/764,238, filed Sep. 23, 1991.

TECHNICAL FIELD

The present invention relates generally to electrical component packages, and more particularly to a package incorporating a heat exchanger for a high power electrical component.

BACKGROUND ART

There is a need, particularly in aircraft and aerospace installations, for compact and light weight power systems. Such power systems typically include a power converter that utilizes multiple highpower switches having voltage and current ratings on the order of 1,000 volts and 1,000 amps, respectively. Such power switches dissipate substantial amounts of power and thus develop heat which can adversely affect the performance of the device and other electrical components in the vicinity thereof. The need to reduce system size and weight, however, greatly complicates the removal of heat.

Prior generating systems have utilized heat exchangers to which semiconductors or other high power handling components are mounted. Such heat exchangers have been of the usual cooling fin type or have been of the type which utilize circulating cooling fluid. An example of the latter type of heat exchanger is known as a jet impingement cooler developed by the assignee of the instant application and which is shown in detail in Bland, et al., U.S. Pat. No. 4,494,171, the disclosure of which is hereby incorporated by reference herein. Jet impingement coolers are generally more efficient at heat removal than fin-type heat exchangers that rely upon movement of cooling fluid in a direction parallel to the faces of the fins.

Heidler, U.S. Pat. No. 3,070,729 discloses a modularized electrical network assembly including a plurality of triangularly shaped miniature circuit subassemblies disposed about a heat exchanger and enclosed in a housing. The heat exchanger includes fins separating the subassemblies wherein the fins provide means for circulating a cooling fluid adjacent each of the subassemblies to remove heat developed thereby.

Sutrina, U.S. Pat. No. 4,614,964 discloses a semiconductor package wherein a plurality of generally equally angularly spaced semiconductors are located in a space between concentric power buses.

Patents disclosing stacked semiconductors with means carrying away heat developed thereby include Grandia, U.S. Pat. No. 3,808,471, Bourbeau, et al., U.S. Pat. No. 4,010,489, Pollard, et al., U.S. Pat. No. 4,504,850, Lutfy, U.S. Pat. No. 4,559,580 (assigned to the assignee of the instant application), Parks, U.S. Pat. No. 4,841,355 and Carlson, U.S. Pat. No. 4,862,249.

SUMMARY OF THE INVENTION

In accordance with the present invention, a heat exchanger is capable of conducting large amounts of heat away from heat producing electrical components.

More particularly, a heat exchanger includes a series of orifice plates stacked in an axial direction and separated from one another by spacer plates wherein the plates terminate at an outer flat wall portion and the orifice plates include offset axial apertures therethrough whereby the flat wall portion is adapted to receive a semiconductor device. The heat exchanger is joined to a base and the base and heat exchanger have aligned axial channels therein for admittance of coolant whereby thermal conduction paths are established in a radial direction and whereby the orifice plates may be thermally linked by coolant flowing in the axial direction thereby.

Preferably, the heat exchanger includes a distribution plenum and a collection plenum at opposite axial ends thereof.

In accordance with the preferred embodiment, a power bus is disposed on the heat exchanger and is adapted to interconnect multiple electrode leads of a semiconductor device. In accordance with a highly preferred form of the invention, the power bus includes a pair of arms coupled to the multiple electrode leads of the semiconductor device. According to an alternative embodiment, the power bus includes a planar electrically conductive portion coupled to the multiple electrode leads of the semiconductor device.

According to a further aspect of the present invention, a cover is mounted on the base and encloses a heat exchanger, the power bus and the semiconductor device. The cover may be electrically conductive and include an electrical connection tab thereon or may be electrically insulative, in which case an electrically conductive terminal is mounted in electrical contact with the base. In either case, the power bus includes an electrically conductive post in coaxial relationship with the cover and extending through an aperture therein and a further conductive post is electrically connected to the control electrode of the transistor and extends through a further aperture of the cover.

In accordance with yet another aspect of the present invention, a power electronics module includes a heat exchanger having at least three outer faces and at least three semiconductor devices mounted on the outer faces wherein each semiconductor device includes first and second electrodes and wherein each first electrode is electrically connected by the heat exchanger to the first electrodes of the remaining semiconductor devices. Means are disposed in proximity to the semiconductor devices for electrically connecting together the second electrodes thereof.

In accordance with still another aspect of the present invention, a power electronics module includes a cylindrical jet impingement cooler of polygonal shape in cross section having a plurality of outer faces about a central axis and a plurality of transistors each disposed in thermal contact with a face of the cooler wherein each transistor has first, second and third electrodes. Means are provided for enclosing the transistors and the cooler and means are disposed in contact with the enclosing means for allowing connection of electrical conductors to the electrodes of the transistors.

The present invention permits fabrication of a switch having very high voltage and current ratings on the order of 1,000 volts and 1,000 amps, respectively, in a volume of less than 4 cubic inches in the preferred embodiment, using semiconductors to be placed in production in the near future. As semiconductor chip sizes are further reduced in the future, the power-to-volume ratio of the package may be increased significantly so that power generation system size and weight can be reduced.

DESCRIPTION OF THE PREFERRED EMBODIMENTS

Figure 1:
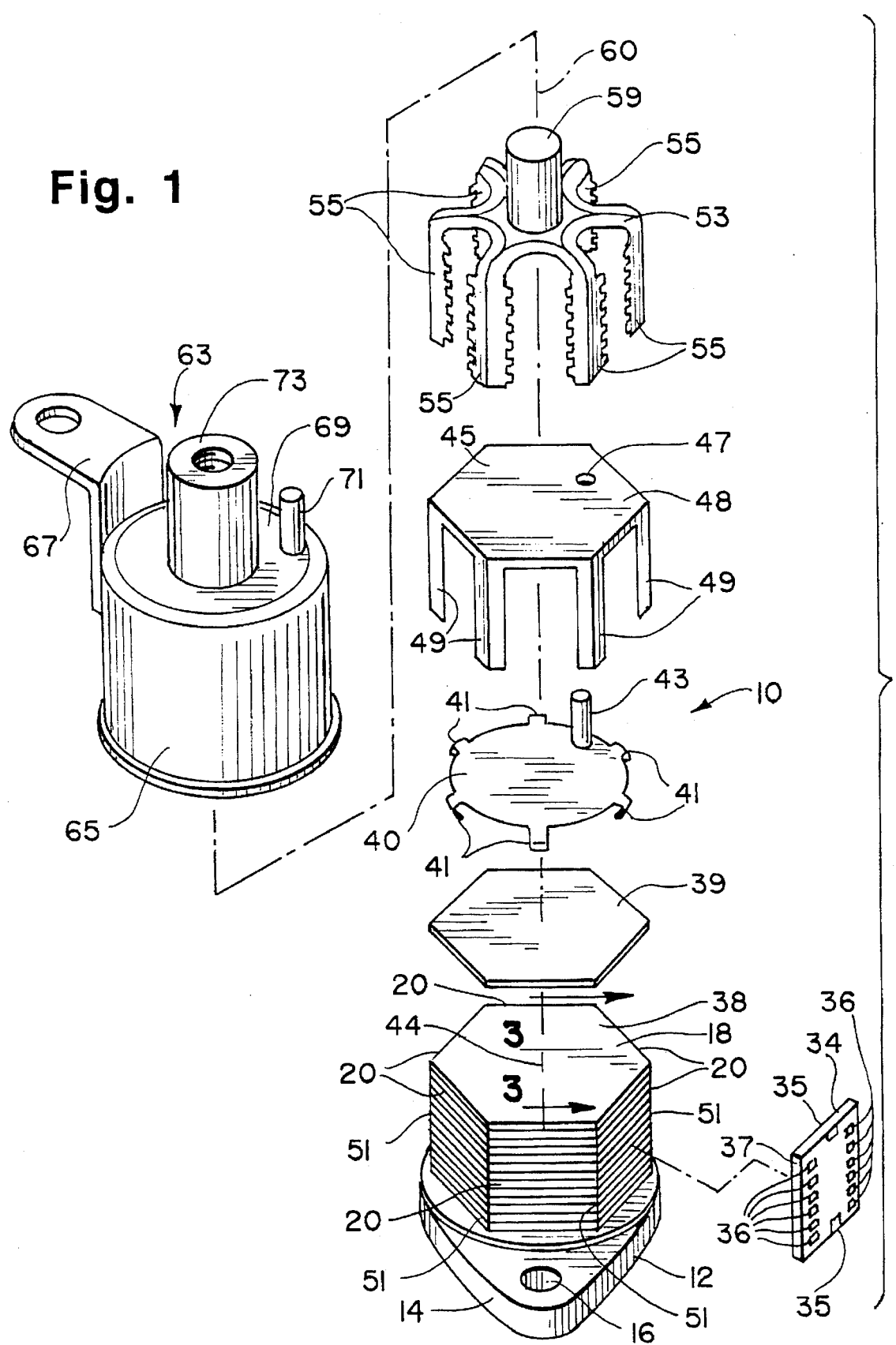
FIG. 1 comprises an exploded isometric view of a heat exchanger and package according to the present invention.

Referring now to FIG. 1, a package 10 for a high power electrical component includes a base 12 fabricated of an electrically and thermally conductive material. The base 12 may include an oversized flange 14 having one or more holes 16 therein for mounting of the package to a circuit board or other substrate.

Disposed on the base 12 is a heat exchanger 18 in the form of a jet impingement cooler which is right cylindrical and polygonal in cross section and includes a series of outer planar faces 20 disposed in differing planes. In the preferred embodiment, there are six faces 20, and hence the heat exchanger is hexagonal in cross section. Also, in the preferred embodiment, the heat exchanger 18 is electrically conductive and, as seen in FIGS. 3–5, includes a series of orifice plates 21 stacked in an axial direction and separated from one another by spacer plates 22.

Figure 3:
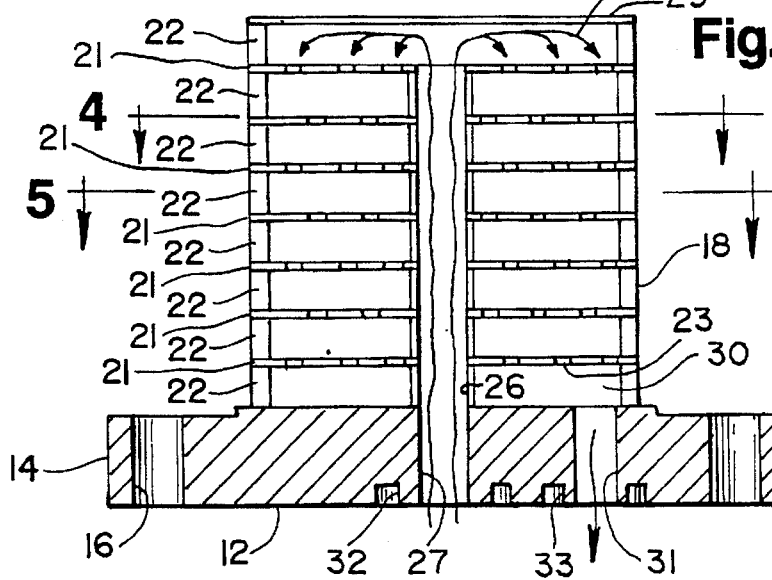
FIG. 3 comprises a sectional view of the heat exchanger taken along the lines 3—3 of FIG. 1.
Figure 4:
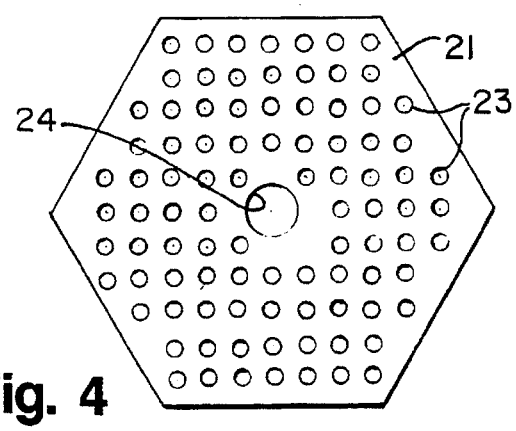
FIG. 4 comprises a sectional view taken generally along the lines 4—4 of FIG. 3.
Figure 5:
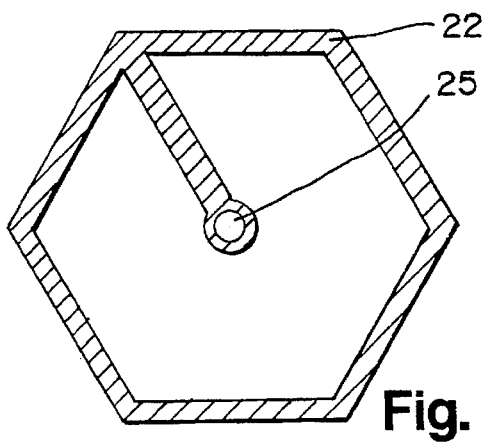
FIG. 5 comprises a sectional view taken generally along the lines 5—5 of FIG. 3.

As seen specifically in FIGS. 3 and 4, the orifice plates 21 include offset apertures 23 therethrough. Each orifice plate 21 includes a central bore 24 which, when the orifice plates 21 are stacked with the spacer plates 22, is aligned with a central tube section 25 carried by the spacer plate 22 to form an axial channel 26. The axial channel 26 is aligned with an axial channel 27 extending through the base 12. The heat exchanger 18 further includes a distribution plenum 28 enclosed in part by a cover plate 29 at a first axial end thereof and a collection plenum 30 at an opposite axial end thereof. The collection plenum 30 is in fluid communication with a fluid channel 31 disposed in the base 12. The base 12 further includes first and second annular channels 32, 33 that accommodate fluid seals (not shown) which prevent leakage of coolant out of the channels 27, 31, respectively, when the base 12 is mounted on a substrate.

If desired, the spacer plates 22 may be modified to omit the central tube sections 25, in which case a separate tube (not shown) extends through the aligned central bores 24 in the orifice plates 21 to direct coolant into the distribution plenum 28.

During operation of the heat exchanger 18, coolant is supplied through the aligned channels 26, 27 and is distributed to the plates 21, 22 through the distribution plenum 28. Heat conduction paths are established through the orifice plates 21 in a radial direction and the orifice plates 21 are thermally linked by coolant flowing in the axial direction therebetween. The offset apertures 23 ensure that coolant is directed against the heat conduction paths perpendicular to the radial heat conduction paths so that cooling efficiency is established at a high level.

Mounted on one or more faces 20 of the heat exchanger 18 are high power electrical components in the form of insulated gate bipolar transistors (IGBT's) 34 that are generally planar in shape wherein each includes a control electrode and main current path electrodes. More specifically, the IGBT's 34 include one or more gate bonding sites 35 and one or more emitter bonding sites 36. In addition, each IGBT 34 includes a Collector electrode 37 on a rear face of the IGBT 34. The IGBT's 34 are soldered or otherwise joined directly to the faces 20, or are soldered or otherwise secured to an intermediate electrically and thermally conductive plate (not shown) having a low coefficient of thermal expansion which is in turn electrically and thermally secured to the face 20. In either event, the collectors 37 of the IGBT 34 are electrically interconnected by the heat exchanger 18 and a path for heat transfer is established from the IGBT 34 to the coolant flowing in the heat exchanger 18.

Disposed atop an upper face 38 of the heat exchanger 18 is a sheet of electrical insulation 39, which may be made of a material known as Nomex, a registered trademark of E. I. Du Pont de Nemours and Company for flexible film for electrical insulation.

An electrically conductive plate comprising a gate bus 40 is disposed atop the sheet of electrical 10 insulation 39. The gate bus 40 is thus electrically isolated from the heat exchanger 18 and includes bonding tabs 41 which are soldered or otherwise electrically connected to the upper gate bonding sites 35 of the IGBT's 34. The gate bus 40 further includes an upwardly extending terminal 43 which is offset from a central axis 44 of the heat exchanger 18.

A further electrical insulator 45 is disposed atop the gate bus 40 such that the terminal 43 extends through an aperture 47 therein. The electrical insulator 45, which may be fabricated of plastic (for example, a thermoplastic fabricated of polyetheretherketone), includes a main body 48 and a plurality of downwardly depending arms 49 which are disposed over and cover corners 51 of the heat exchanger 18 at which adjacent faces 20 meet. An electrically conductive emitter power bus 53 is disposed atop the electrical insulator 45, in the preferred embodiment, includes a plurality of arms 55 which are disposed over the main body 48 and the arms 49 of the electrical insulator 45. The downwardly depending portions of the arms 55 are thus electrically isolated from the heat exchanger 18 by the arms 49 and the emitter bus 53 is further electrically isolated from the gate bus 40 by the main body 48 of the electrical insulator 45.

The sheet of electrical insulation 39, the gate bus 40, the electrical insulator 45 and the emitter bus 53 are maintained in place atop the heat exchanger 18 by adhesive and fasteners, as required.

Figure 2:
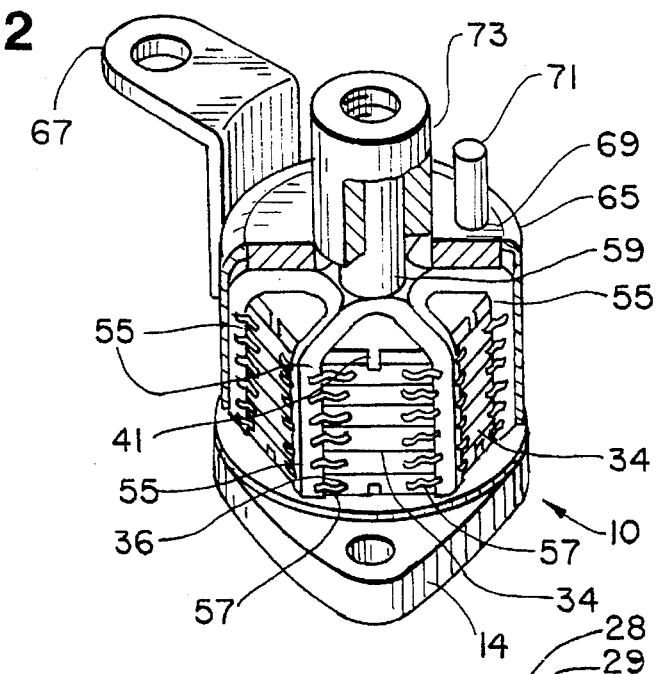
FIG. 2 comprises an isometric view, partly in section, of the assembled package of FIG. 1.

As seen in FIG. 2, wire bonds 57 are attached between the emitter bonding sites 36 of the IGBT's 34 and an adjacent leg 55 of the emitter bus 53. As should be evident from the foregoing discussion, the six IGBT's 34 are thus electrically connected in parallel with the gates of the IGBT's 34 connected together by the gate bus 40, the emitters connected together by the emitter bus 53 and the collectors connected together by the heat exchanger 18.

The emitter bus 53 further includes an upwardly extending post 59 which, when assembled on the heat exchanger 18 and intervening components, includes a central axis 60 coincident with the central axis 44 of the heat exchanger 18. A cover assembly 63 includes a right circular cylindrical, electrically conductive main body 65 which, in the preferred embodiment, is cold welded or otherwise joined to the base 12 and is thus electrically connected thereto. An electrically conductive connection terminal in the form of a tab 67 is soldered or otherwise electrically and mechanically joined to the main body 65. Inasmuch as the collectors of the IGBT's 34 are electrically connected to the heat exchanger 18 and the base 12, and since the base 12 is electrically connected to the cover 65, it follows that a path for collector currents may be established to other components through the connection tab 67.

The cover assembly 63 further includes an electrically insulative washer-shaped top plate 69 fabricated of ceramic, glass or another electrically insulating material. Carried by the top plate 69 is an electrically conductive base connection post 71 and an electrically conductive emitter connection post 73, both of which are electrically isolated from each other and from the main body 65 and the connection tab 67. The posts 71, 73 are crimped or otherwise electrically connected to the terminal 43 and the post 59, respectively. In addition, the post 71 is coincident with the central axis 44 of the heat exchanger 18 while the base connection post 71 is offset relative thereto. Since the collector and emitter currents are conducted through concentric conductors, and since current flow occurs in opposite directions in the body 65 and the post 73, cancellation of magnetic fields arising from such current flow is accomplished.

Further, the particular arrangement of the connection tab 67 and the connection post 73 is such as to facilitate utilization of laminated flat bus work in circuitry external of the package 10, again allowing cancellation of magnetic fields and greatly reducing parasitic inductance losses.

It should be noted that while the illustrated embodiment shows six IGBT's connected in parallel within a single package, the package may alternatively contain a different number of IGBT's connected in parallel or connected in a different circuit configuration. In such a case, emitter and gate buses of different design would be used to interconnect IGBT electrodes as required. Thus, for example, a full inverter phase can be constructed wherein three IGBT's are connected in parallel and comprise an upper inverter phase switch and the remaining three IGBT's are also connected in parallel and comprise a lower inverter phase switch. In this case, the emitter and base buses must each be divided into two separate buses each having a terminal or post for connection thereto.

Figure 6:
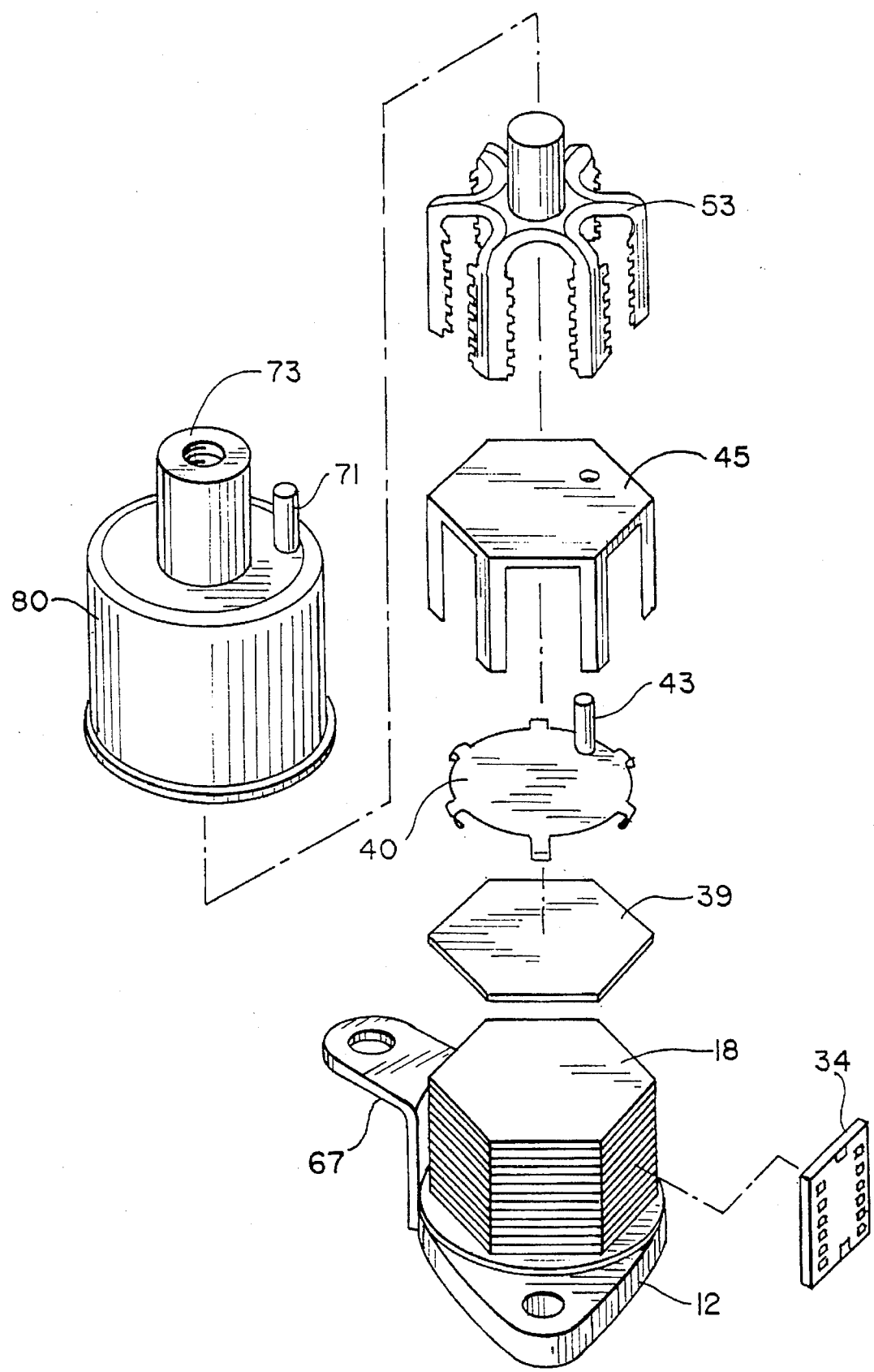
FIG. 6 comprises an exploded isometric view similar to FIG. 1 illustrating an alternative embodiment of the present invention.

FIG. 6 illustrates an alternative embodiment of the present invention wherein the hermetic construction of FIGS. 1–5 is replaced by a nonhermetic package. Elements common to FIGS. 1 and 6 are assigned the same reference numerals. In the embodiment of FIG. 6, the electrically conductive cover 63 is replaced by an electrically nonconductive cover 80 fabricated of an electrically insulative material, such as plastic. Carried by the cover 80 are the base connection post 71 and the emitter connection post 73. The connection tab 67 is not carried by the cover 80; rather, the tab 67 is soldered or otherwise electrically connected to and carried by the base 12. The cover 80 is secured by adhesive or any other suitable means to the base 12 such that it encloses the heat exchanger 18, the IGBT's 34 and the remaining components of the package.

Figure 7:
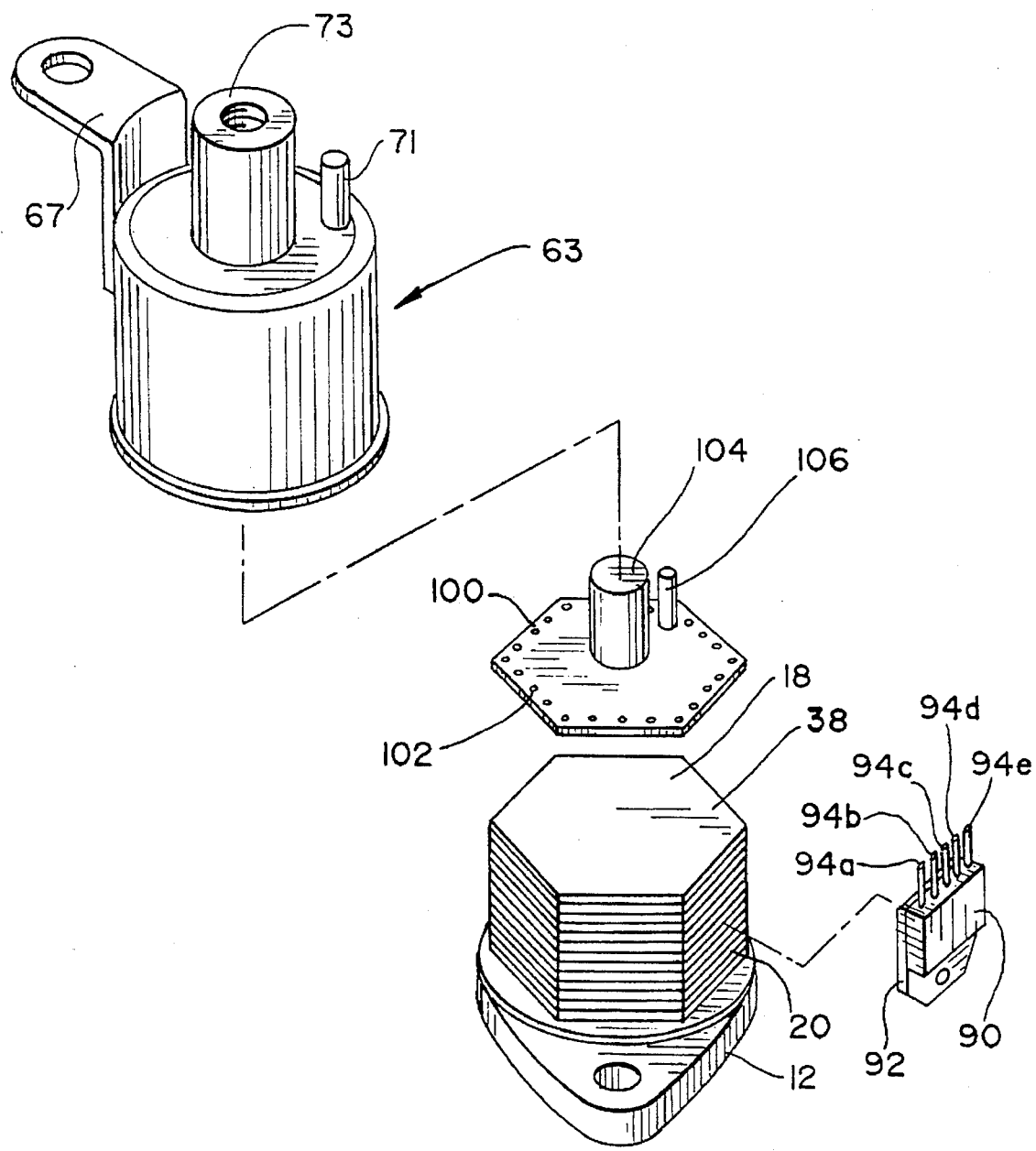
FIG. 7 comprises an exploded isometric view similar to FIGS. 1 and 6 illustrating a still further alternative embodiment of the present invention.

FIG. 7 illustrates a still further embodiment of the present invention. Again, elements common to FIGS. 1 and 7 are assigned like reference numerals. In the embodiment of FIG. 7, the IGBT's 34 are replaced by hermetically sealed transistor packages 90. Each package 90 includes an electrically conductive mounting plate 92 that is coupled to a first main current path electrode of the transistor 90 and a series of electrode conductors 94a–94e. The electrode conductors 94a, 94b are connected to a second main current electrode of the transistor 90. The electrode conductors 94c, 94d comprise Kelvin connections for the IGBT 90 while the electrode conductor 94e is coupled to the control or gate electrode of the IGBT 90. The IGBT 90 comprises a TO220 or TO258 semiconductor device, although it may comprise a different device, if desired. The electrode plate 92 of each IGBT 90 is soldered to a face 20 of the heat exchanger 18 such that the electrode conductors 94a–94e extend upwardly away from the base 12 above the upper face 38 thereof. A power bus 100 includes a series of via holes 102 through which the electrode conductors 94a–94e extend. The power bus 100 may comprise a multi-layer circuit board having conductive traces and pathways and pathways which serve to connect the electrode conductors 94a, 94b of the devices 90 together to an electrically conductive terminal post 104 centrally mounted on the bus 100. In like fashion, conductive traces and pathways interconnect the electrodes 94e of the transistors 90 together to an electrically conductive connection post 106 mounted on the bus 100. If necessary or desirable, further electrically conductive posts may be mounted on the bus 100 and conductive traces may be supplied to interconnect the electrode conductors 94c and the electrode conductors 94d to such posts. As before, the first main current path electrodes of the transistors 90 are interconnected by the heat exchanger 18.

As with the embodiment of FIGS. 1–5, the cover assembly 63 is placed over the assembled component and is cold welded or otherwise joined to the base 12. As before, the posts 71, 73 are crimped or otherwise electrically connected to the posts 104, 106.

Alternatively, the cover 80 of FIG. 6 may be secured by adhesive or other means to the base 12. In that event, the connection tab 67 is electrically mounted on the base 12, as before.

While the embodiment of FIG. 7 results in a larger package for a given power rating than the embodiments of FIGS. 1–6, this disadvantage is at least partially offset by the simplified construction of the package.

In each of the foregoing embodiments, the heat exchanger 18 is electrically connected directly to the base 12. If necessary or desirable, the heat exchanger 18 may be electrically isolated from the base 12 by means of an insulating substrate and a further terminal may be connected to the heat exchanger 18 to permit connection to the collectors of the IGBT's, if desired.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come with the scope of the appended claims is reserved.

I claim:

1. A heat exchanger comprising:

a series of orifice plates stacked in an axial direction and separated from one another by spacer plates, the plates all terminating at an outer flat wall portion and the orifice plates having offset axial apertures therethrough, the flat wall being adapted to receive a heat source; and a base to which the heat exchanger is joined;

wherein the base and heat exchanger have aligned axial channels therein for admittance of coolant whereby thermal conduction paths are established in a radial direction and wherein the orifice plates may be thermally linked by coolant flowing in the axial direction therebetween; and a heat source mounted on said outer flat wall portion.

2. The heat exchanger of claim 1, further including a distribution plenum and a collection plenum at opposite axial ends thereof.

3. The heat exchanger of claim 1 wherein said heat exchanger defines a single fluid circuit therein for passage therethrough of said coolant; and said heat source is thermally linked to said coolant by thermal conduction through said wall.

* * * * *